(12) United States Patent
Hwang et al.

(10) Patent No.: US 8,678,065 B2
(45) Date of Patent: Mar. 25, 2014

(54) CARRIER TAPE FEEDER

(75) Inventors: Young Soo Hwang, Seongnam-si (KR);
Yong Sung Kim, Gwangju-si (KR); Su Hong Park, Gwangju-si (KR); Hee Jong Kim, Seongnam-si (KR)

(73) Assignee: STS Co., Ltd., Gyeonggi-do (KR)

( * ) Notice: Subject to any disclaimer, the term of this patent is extended or adjusted under 35 U.S.C. 154(b) by 513 days.

(21) Appl. No.: 12/985,642

(22) Filed: Jan. 6, 2011

(65) Prior Publication Data

US 2011/0243695 A1   Oct. 6, 2011

(30) Foreign Application Priority Data

Mar. 30, 2010 (KR) .......................... 10-2010-0028396
Apr. 8, 2010 (KR) .......................... 10-2010-0032238
Sep. 10, 2010 (KR) .......................... 10-2010-0089099

(51) Int. Cl.
*B32B 38/10* (2006.01)

(52) U.S. Cl.
USPC ............... 156/764; 156/941; 221/25; 221/72; 414/411; 414/416.05; 225/23

(58) Field of Classification Search
USPC ........ 156/714, 764, 930, 941; 221/25, 72, 73, 221/79, 87; 414/411, 416.01, 416.03, 414/416.05, 416.08, 412, 425, 811
See application file for complete search history.

(56) References Cited

U.S. PATENT DOCUMENTS

| 4,820,369 | A  | * | 4/1989 | Kubo ........................... | 156/716 |
| 8,353,424 | B2 | * | 1/2013 | Ikeda et al. ..................... | 221/25 |
| 2007/0241028 | A1 | * | 10/2007 | Larsson et al. ................ | 206/714 |
| 2010/0239401 | A1 | * | 9/2010 | Kim ............................. | 414/412 |
| 2012/0305585 | A1 | * | 12/2012 | Nagao et al. .................... | 221/25 |

* cited by examiner

*Primary Examiner* — Mark A Osele
(74) *Attorney, Agent, or Firm* — Ladas & Parry LLP

(57) ABSTRACT

A carrier tape feeder is provided. The carrier tape feeder includes a unit for loading a carrier tape, a picking-up unit where chips are picked up, and a driving unit. The pick-up unit includes a knife portion, a folding-guiding portion, and an inversion-guiding portion. The knife portion separates a cover tape from a base tape in a first adhesive portion. The folding-guiding portion is spaced from one lateral side of the knife portion to induce folding of the cover tape separated by the knife portion in the lengthwise direction in a state in which the cover tape is partially attached to the base tape in a second adhesive portion. The inversion-guiding portion extends in an oblique direction from the knife portion and the folding-guiding portion toward the outside of the carrier tape to induce inversion of the upper and lower surfaces of the cover tape folded in the folding-guiding portion so as to be superimposed on the base tape. The distal end of the lateral side of the folding-guiding portion opposed to the knife portion extends above the second adhesive portion.

10 Claims, 27 Drawing Sheets

(a)

(b)

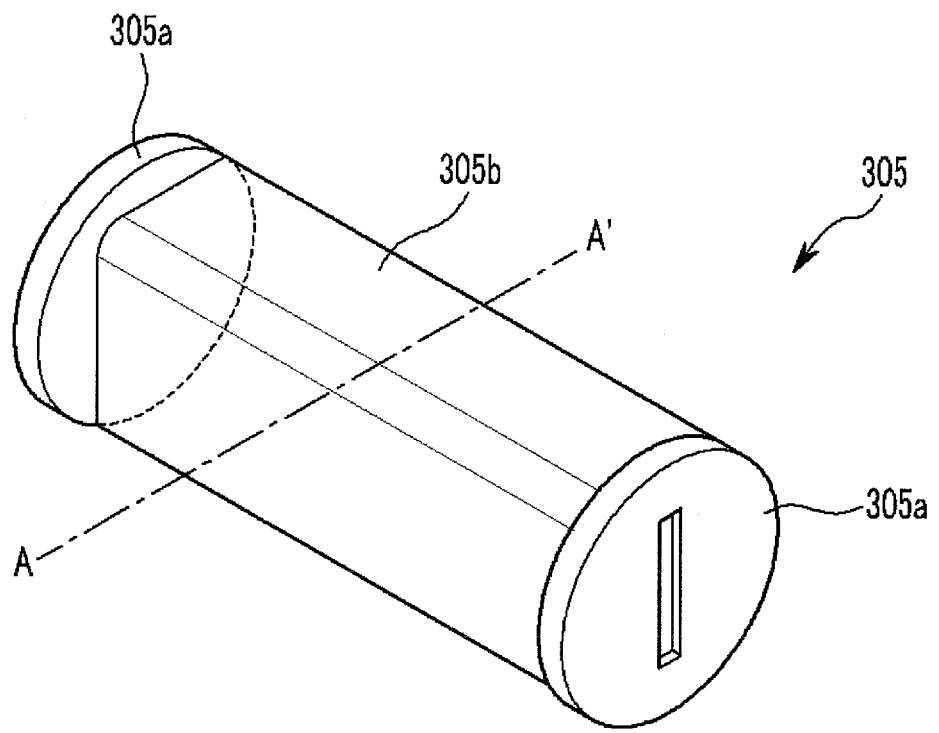

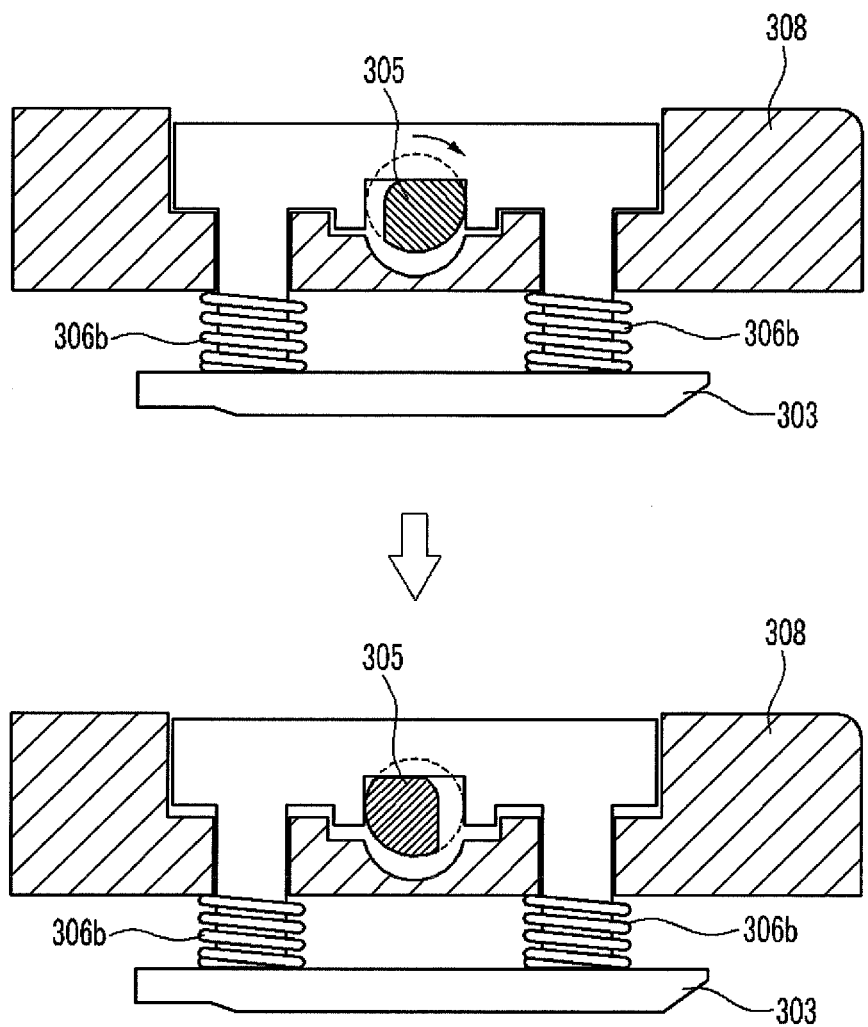

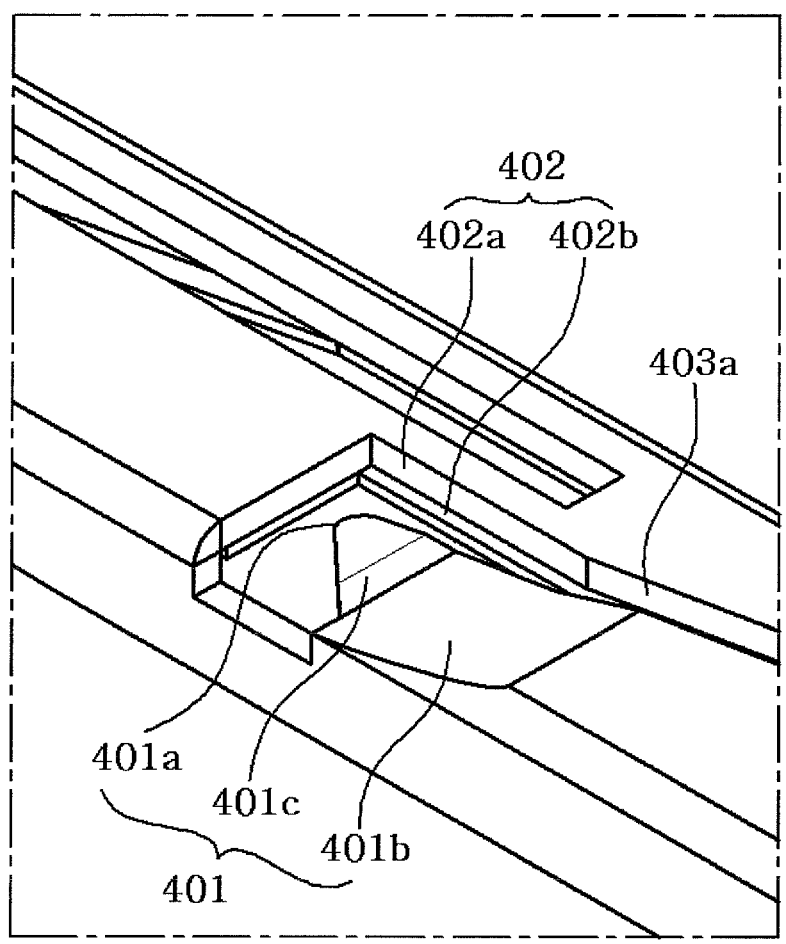

CARRIER TAPE FEEDER

BACKGROUND OF THE INVENTION

1. Field of the Invention

The present invention relates to a carrier tape feeder, and more specifically to an apparatus for continuous feeding of carrier tapes into a chip mounter.

2. Description of the Related Art

A chip mounter is an apparatus for high-speed, high-precision mounting electronic chips fed from a feeder on preset positions of a printed circuit board. In such a chip mounter, suction nozzles of a head are used to mount electronic chips. With the recent trend toward multifunctional, high-specification and downsized electronic devices, the need is increasing to develop techniques for mounting electronic chips in high density on printed circuit boards of the electronic devices. Technology for mounting chips on printed circuit boards is shifting from through-hole mounting to surface mounted technology (SMT). Surface mounted technology is used to directly mount chips in high density on the surface of printed circuit boards. Surface mounting devices (SMDs) for use in surface mounted technology are classified into tape roll, tray and stick types according to the feeding form of chips. Chip feeders are also classified into tape feeders, tray feeders and stick feeders by their chip feeding mode according to the type of surface mounting devices. Of these, the most widely used are tape feeders that feed chips in the form of carrier tapes. An advantage of tape feeders is the ability to feed a number of chips at high speed. A typical carrier tape consists of a base tape, storage spaces formed at regular pitches in the base tape and a cover tape attached to the upper surface of the base tape. Small-sized electronic chips, such as semiconductor chips, are accommodated in the storage spaces of the carrier tape. The cover tape is taped on the upper surface of base tape protects the electronic chips. Due to this construction, the carrier tape functions as a carrier to smoothly feed the electronic chips, such as semiconductor chips, into a chip mounter.

FIG. 1 illustrates (a) a state of a general carrier tape 100 in which a portion of a cover tape 102 is separated from a base tape 101, and (b) a cross-sectional view taken along line A-A' of (a). Referring to FIG. 1, the carrier tape 100 consists of a base tape 101 and a cover tape 102 attached to the upper surface of the base tape 101. The base tape 101 is made of paper and has transport holes 103 formed at regular intervals at one lateral side thereof. The base tape 101 has storage spaces 104 with a predetermined depth to accommodate semiconductor chips (not shown) therein. The cover tape 102 is made of a transparent polymer film and is attached to the base tape 101 through adhesive portions 105 consisting of a first adhesive portion 105a and a second adhesive portion 105b. The carrier tape is generally wound on a reel for commercialization. While a tape feeder locks the transport holes of the base tape to move the carrier tape by specific pitches, the cover tape is separated from the base tape and the storage spaces are exposed so that the electronic chips can be picked-up by suction nozzles of a mounter.

A general carrier tape wound on a reel is fed into a carrier tape feeder. When electronic chips accommodated in the carrier tape are completely picked up, a new carrier tape reel must be loaded into the tape feeder. Since only one carrier tape reel can be loaded at a time into a general carrier tape feeder, a new carrier tape reel must be loaded into the carrier tape feeder after the carrier tapes are completely used up. Such loading process makes it impossible to continuously feed carrier tapes into the carrier tape feeder, causing prolonged working time. Further, an operator must watch the feeding state of the carrier tapes to check whether the carrier tapes are exhausted, which becomes a cause of deterioration in workability.

A general carrier tape feeder is designed such that base tapes and cover tapes are separately discharged after the cover tapes are completely separated from the base tapes. However, this design may cause entangling of the cover tapes to generate static electricity. Further, materials for the cover tapes may cause variations in the pitch of the carrier tapes in view of their characteristics, making it difficult to pick up electronic chips accurately. Several carrier tape feeders may be loaded on a chip mounter. This case may cause more serious static electricity problems because a larger number of cover tapes discharged from the tape feeders get entangled or come into contact with each other. Such static electricity problems may increase the number of defects or may lead to an increase in working time, giving a negative influence on productivity.

SUMMARY OF THE INVENTION

It is, therefore, an object of the present invention to provide a carrier tape feeder that folds cover tapes separated from base tapes in the lengthwise direction and discharges the cover tapes and the base tapes simultaneously, which simplify the discharge process of the carrier tapes and prevent the cover tapes from getting entangled or coming into contact with each other to generate static electricity, leading to productivity improvement, and that enables continuous loading of a plurality of carrier tape reels.

In order to accomplish the above object of the present invention, there is provided a carrier tape feeder including: a unit for loading a carrier tape; a picking-up unit where chips accommodated in the carrier tape transferred from the loading unit are exposed and picked up; and a driving unit, wherein the pick-up unit includes a knife portion for separating a cover tape from a base tape in a first adhesive portion, a folding-guiding portion spaced from one lateral side of the knife portion to induce folding of the cover tape separated by the knife portion in the lengthwise direction in a state in which the cover tape is partially attached to the base tape in a second adhesive portion, and an inversion-guiding portion extending in an oblique direction from the knife portion and the folding-guiding portion toward the outside of the carrier tape to induce inversion of the upper and lower surfaces of the cover tape folded in the folding-guiding portion so as to be superimposed on the base tape, and wherein the distal end of the lateral side of the folding-guiding portion opposed to the knife portion extends above the second adhesive portion.

In an embodiment, the folding-guiding portion may have a lower surface at a higher level than the blade of the knife portion.

In an embodiment, the loading unit may include: a lower support having an inclined portion to vary the feeding angle of first and second carrier tapes while supporting the lower surface of the carrier tapes, and a horizontal portion; a first pad disposed above the horizontal portion and having a lower surface parallel to the horizontal portion and elastic members to pressurize the upper surface of the first carrier tape; and a second pad disposed above the inclined portion and having a lower surface parallel to the inclined portion and elastic members to pressurize the second carrier tape overlapping and loaded on the first carrier tape.

In an embodiment, a stepped portion may be formed at a boundary between the lower surface of the first pad and the horizontal portion and the inclined portion of the lower support.

In an embodiment, the carrier tape feeder may further include a height adjuster for the first pad.

In an embodiment, the carrier tape feeder may further include a unit for discharging the cover tape separated from the pick-up unit backward.

In an embodiment, the driving unit may include a driving motor, a first power transmission assembly, a second power transmission assembly, a first belt and a second belt to transmit a driving force from the driving motor to the loading unit, the pick-up unit and the discharge unit, and the driving force is transmitted to the pick-up unit through the first power transmission assembly, to the loading unit through the second power transmission assembly, the first belt and the second belt, and to the discharge unit through the second power transmission assembly and the first belt.

In an embodiment, the driving unit may include first driving means for driving the loading unit and the discharge unit, and second driving means for driving the pick-up unit.

In an embodiment, the carrier tape feeder may further include sensing units for detecting the transfer state of the carrier tape and a sensing unit for detecting the discharge state of the cover tape.

In an embodiment, the carrier tape feeder may further include a plurality of reel stands installed under the loading unit to load carrier tape reels therein.

In an embodiment, the reel stands may be an upper reel stand and a lower reel stand turnably connected to the upper reel stand in a vertical direction.

In an embodiment, the loading unit may include a sensing unit capable of determining whether or not chips are present.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 5a to 5c illustrate a height adjuster of a loading unit of a carrier tape feeder according to an embodiment of the present invention;

FIGS. 6a to 6d illustrate a pick-up unit of a carrier tape feeder according to an embodiment of the present invention;

DETAILED DESCRIPTION OF THE INVENTION

Exemplary embodiments of the present invention will now be described in detail.

The present invention provides a carrier tape feeder including a unit for loading a carrier tape, a picking-up unit and a driving unit, wherein the pick-up unit includes a knife portion for separating a cover tape from a base tape in a first adhesive portion, a folding-guiding portion spaced from one lateral side of the knife portion to induce folding of the cover tape separated by the knife portion in the lengthwise direction in a state in which the cover tape is partially attached to the base tape in a second adhesive portion, and an inversion-guiding portion extending in an oblique direction from the knife portion and the folding-guiding portion toward the outside of the carrier tape to induce inversion of the upper and lower surfaces of the cover tape folded in the folding-guiding portion so as to be superimposed on the base tape, and wherein the distal end of the lateral side of the folding-guiding portion opposed to the knife portion extends above the second adhesive portion.

Figure 2:
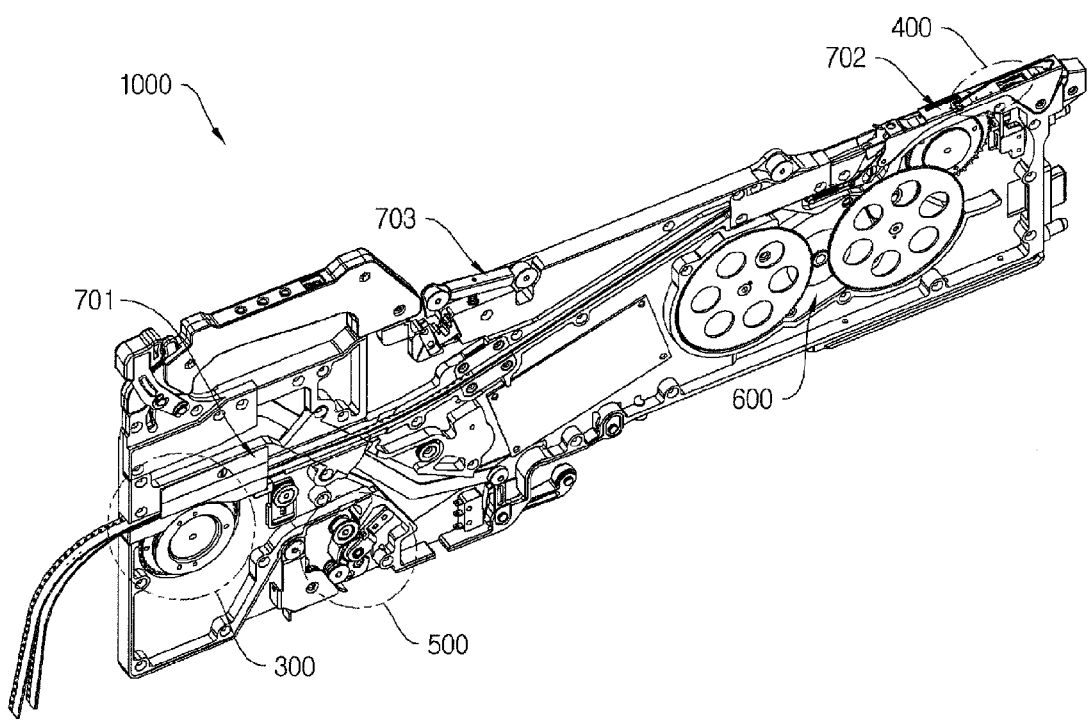
FIG. 2 illustrates a carrier tape feeder according to an embodiment of the present invention.

FIG. 2 illustrates a carrier tape feeder according to an embodiment of the present invention. Referring to FIG. 2, the carrier tape feeder 1000 includes a unit 300 for loading carrier tapes, a unit 400 for picking up chips, a unit 500 for discharging cover tapes, a driving unit 600, and sensing units 701, 702 and 703. The loading unit 300 serves for the continuous feeding of carrier tapes in a wound state. The pick-up unit 400 is constructed such that chips accommodated in the carrier tapes transferred from the loading unit are exposed to allow the chips to be picked up by a chip mounter. The discharge unit 500 is constructed such that the cover tapes discharged from the pick-up unit are discharged backward. The driving unit is constructed such that a driving force generated by means of a driving motor can be transmitted to the loading unit, the pick-up unit and the discharge unit. The sensing units are constructed such that the transfer states of the carrier tapes through the loading unit, the pick-up unit and the discharge unit can be monitored. The respective units of the carrier tape feeder 1000 will be explained in more detail below.

Figure 3A:
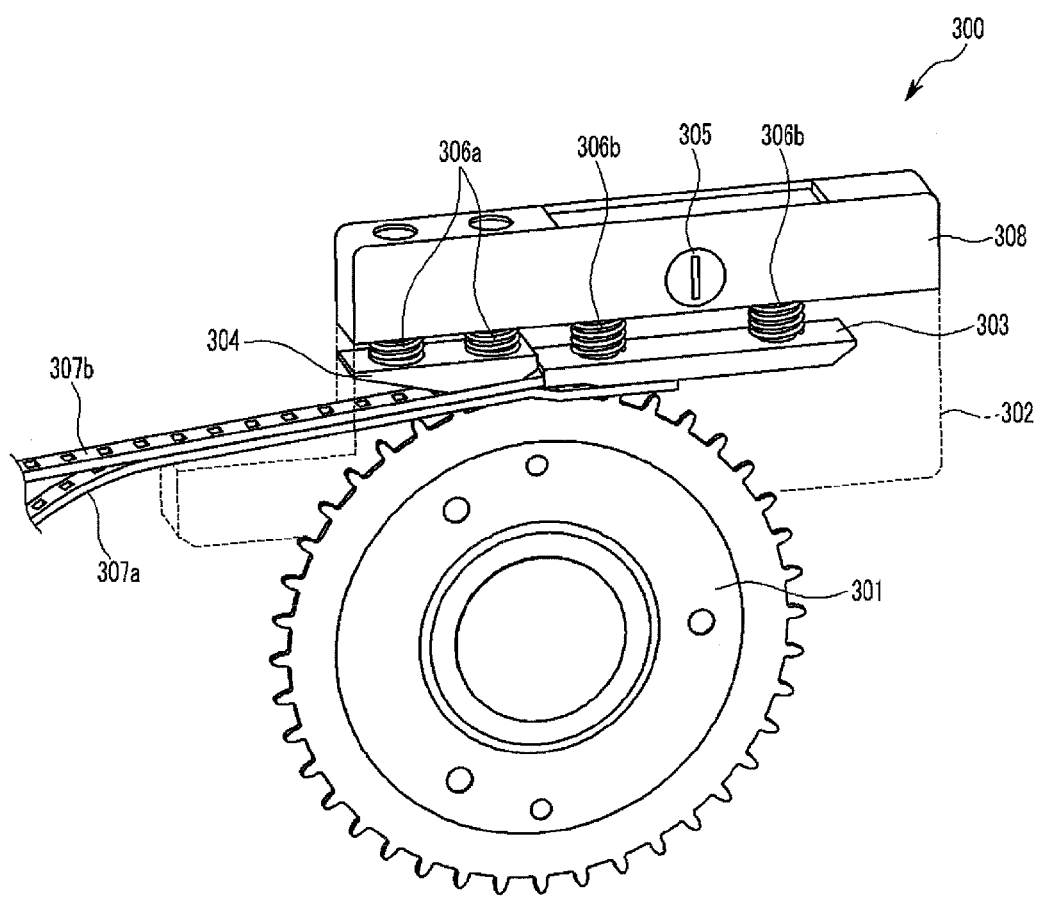
FIGS. 3a to 3c illustrate a loading unit of a carrier tape feeder according to an embodiment of the present invention.
Figure 3B:
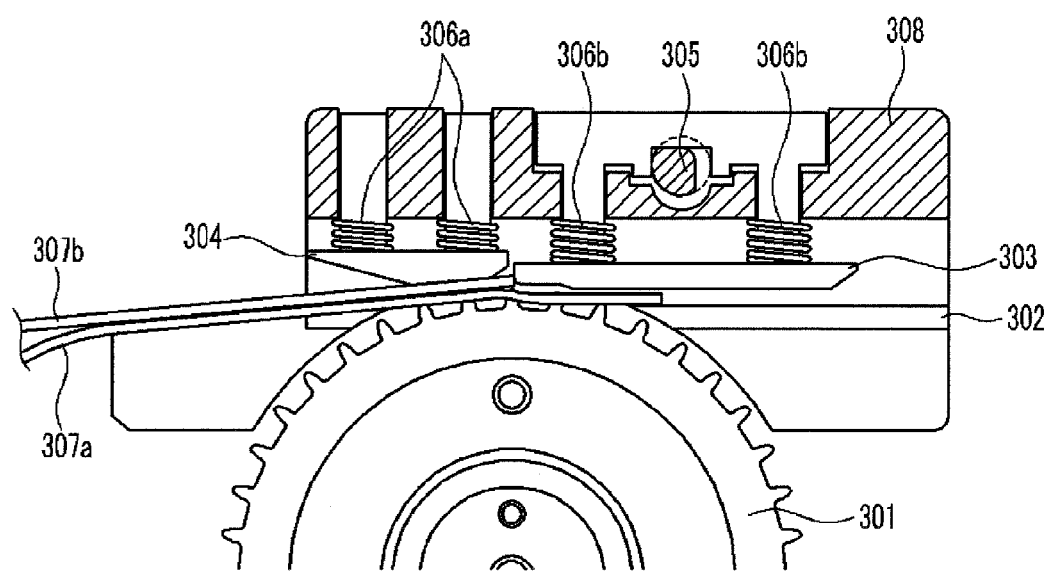
Figure 3C:
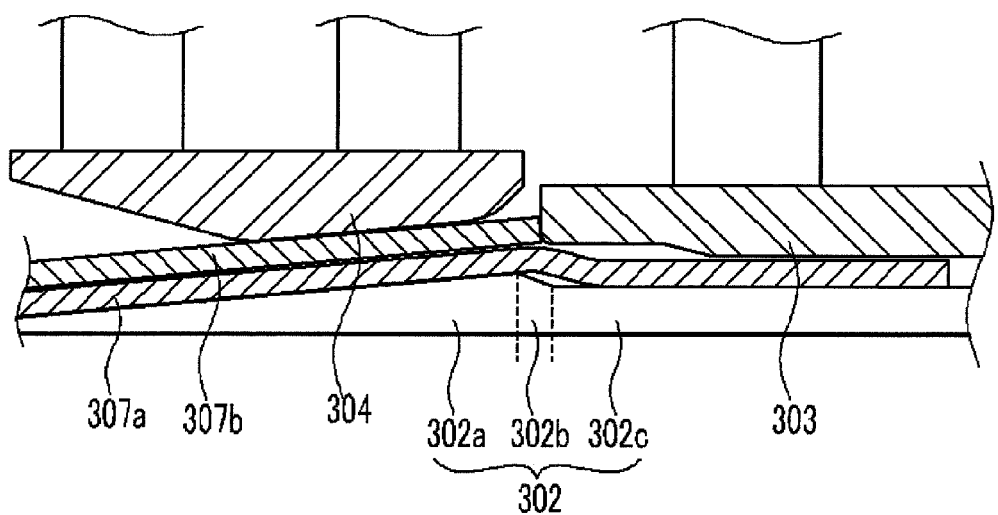

FIGS. 3a to 3c illustrate the loading unit 300 of the carrier tape feeder 1000. Referring to FIGS. 3a to 3c, the loading unit 300 includes a loading driver 301, a lower support 302, a first pad 303, a second pad 304, a height adjuster 305 for the first pad 303, elastic members 306a and 306b, and an upper support 308. A first carrier tape 307a is fed into the loading unit 300 of the carrier tape feeder 1000, and then a second carrier tape 307b is ready to be loaded on the first carrier tape 307a.

A sprocket is formed around the loading driver 301. The sprocket is engaged with transport holes of the carrier tapes to transfer the carrier tapes in one direction. The lower support 302 supports the lower surface of the loaded carrier tape or the carrier tape ready for feeding. The lower support 302 has a through-hole (not shown) through which the sprocket of the loading driver can pass. The lower support 302 has a horizontal portion 302c, a stepped portion 302b and an inclined portion 302a. This structure facilitates the introduction of the first and second carrier tapes 307a and 307b into a space defined by the first pad 303, the second pad 304 and the lower support 302, and allows the second carrier tape 307b to be ready to be fed when the first carrier tape 307a is fed. The first pad 303 is disposed above the horizontal portion 302c of the lower support 302. The first pad 303 has a lower surface parallel to the horizontal portion 302c of the lower support 302. The elastic members 306b of the first pad 303 pressurize the upper surface of the first carrier tape 307a to stabilize the transfer of the first carrier tape 307a. The second pad 304 is disposed above the inclined portion 302a of the lower support 302 and has a lower surface parallel to the inclined portion 302c of the lower support 302. The elastic members 306a of the second pad 304 allow the second carrier tape 307b to be in a loading state before transfer. The upper support 308 is movable a certain distance in upward and downward directions and supports the first and second pads 303 and 304. The upper support 308 supports one end of each of the elastic members 306a and 306b so that the first and second pads 303 and 304 can apply a force toward the lower support 302 due to the elasticity of the elastic members 306a and 306b. The height adjuster 305 is rotatably coupled to the upper support 308 and can determine the position of the first pad 303 depending on its rotating angle.

FIG. 3c is a view for explaining a state in which the first carrier tape is fed from the loading unit and the second carrier tape is ready to be loaded. Referring to FIG. 3c, when the first carrier tape 307a is pushed into a space defined by the first and second pads 303 and 304 and the lower support 302, the first carrier tape 307a is inserted between the second pad 304 and the inclined portion 302a of the lower support by a tilt angle of a lateral side of the second pad 304, enters an empty space defined by a stepped portion formed at the lower surface of the first pad 303 and the stepped portion 302b of the lower support, and is naturally inserted between the first pad 303 and the horizontal portion 302c of the lower support. Here, it is preferred to control the angle of the inclined portion 302a of the lower support, the step height of the stepped portion 302 and the height of the stepped portion of the first pad such that the upper distal end of the first carrier tape 307a is introduced into the space between the stepped portion of the first pad 303 and the stepped portion 302b of the lower support by pushing. For ease of explanation, the figure shows that the first and second pads 303 and 304 are spaced from the first carrier tape 307a and the first and second carrier tapes 307a and 307b are spaced from each other. In reality, the first and second pads 303 and 304 may be in contact with the first carrier tape 307a and the first and second carrier tapes 307a and 307b may be in contact with each other. When the second carrier tape 307b is pushed along the upper surface of the first carrier tape 307a after the loading of the first carrier tape 307a (or during transfer of the first carrier tape 307a), the second carrier tape 307b is inserted between the second pad 304 and the inclined portion 302a of the lower support, similarly to the insertion of the first carrier tape 307a. The second carrier tape 307b inserted between the second pad 304 and the inclined portion 302a of the lower support 302 is fixedly positioned by the pressurization of the second pad 304 and is ready to be loaded.

The second carrier tape 307b inserted between the second pad 304 and the inclined portion 302a of the lower support is stopped by the front end of the first pad 303 and does not proceed any further. After the first carrier tape 307a completely escapes the inclined portion 302a or the stepped portion 302b of the lower support 302, the second carrier tape 307b is moved downward by the pressurization of the second pad 304 and is inserted between the first pad 303 and the horizontal portion 302c of the lower support. This insertion process will be explained in more detail with reference to FIGS. 4a to 4d.

Figure 4A:
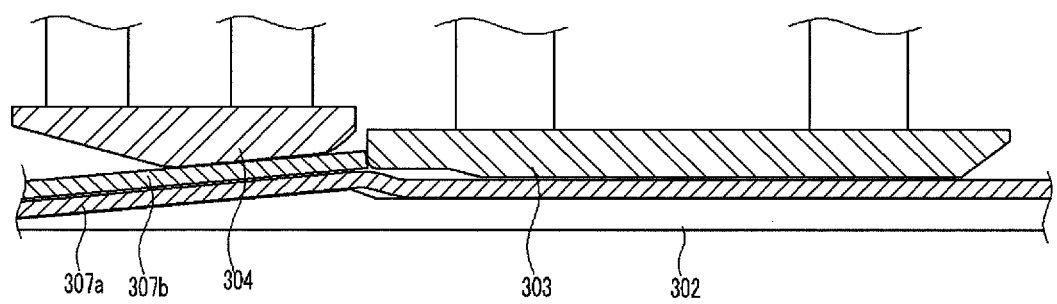
FIGS. 4a to 4d illustrate an automatic continuous feeding process of carrier tapes in a loading unit of a carrier tape feeder according to an embodiment of the present invention.
Figure 4B:
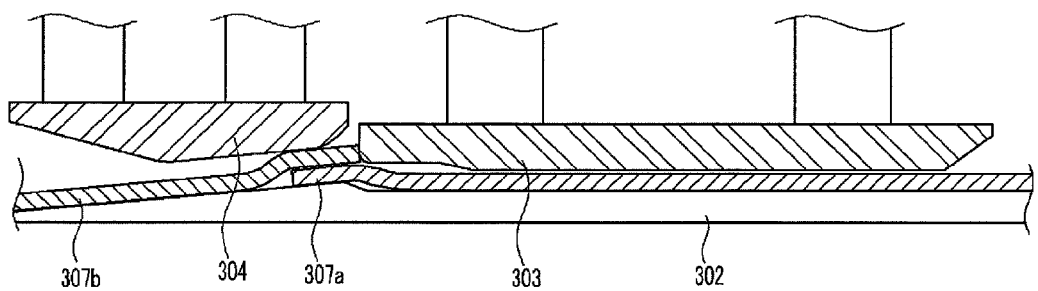
Figure 4C:
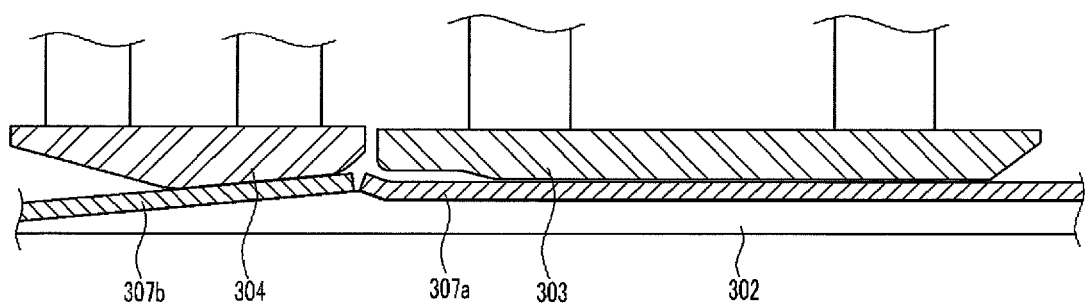
Figure 4D:
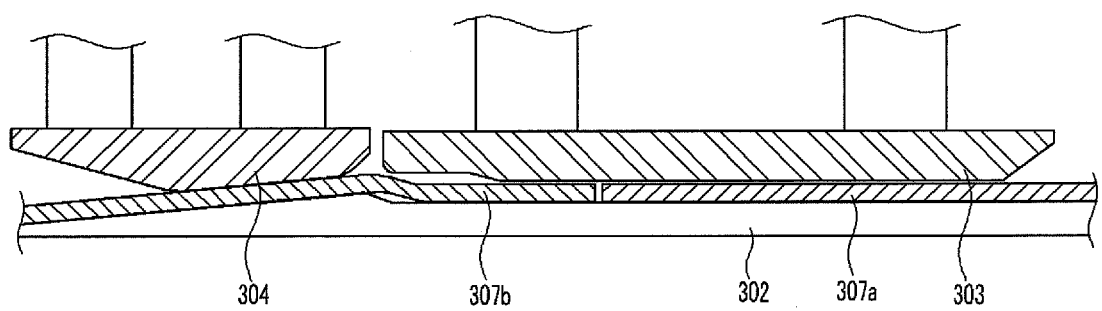

FIGS. 4a to 4d illustrate an automatic continuous feeding process of the carrier tapes in the loading unit. Referring to FIG. 4a, the first carrier tape 307a is introduced into the space between the first pad 303 and the lower support 302, and the second carrier tape 307b is stopped by the distal end of the first pad 303. The second carrier tape 307b is ready to be fed in a fixed position by the pressurization of the second pad 304. Referring to FIG. 4b, even when the first carrier tape 307a almost escapes, leaving a small space between the lower support 302 and the second carrier tape 307b, the second pad 304 continues to push down the first and second carrier tapes 307a and 307b while keeping its original position. Referring to FIG. 4c, when the first carrier tape 307a completely escapes from the region of the second pad 304, the second carrier tape 307b is brought into contact with the lower support 302 by the pressurization of the second pad 304. In this state, the second carrier tape 307b is positioned at the same height as the first carrier tape 307a before being inserted into the space between the first pad 303 and the lower support. Then, the second carrier tape 307b follows the first carrier tape 307a and is inserted into the space between the first pad 303 and the lower support. Referring to FIG. 4d, the second carrier tape 307b is continuously fed into the carrier tape feeder while keeping a distance from the rear end of the first carrier tape 307a. Although not shown, another carrier tape can be loaded during feeding of the second carrier tape 307b. In this manner, the carrier tapes can be continuously fed into the carrier tape feeder.

Figure 5B:
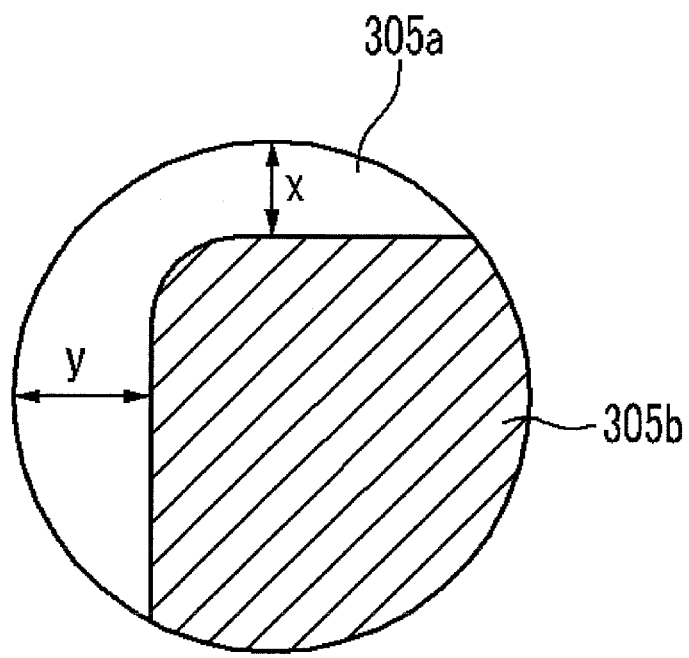

FIGS. 5a to 5c illustrate the height adjuster of the loading unit. The height adjuster serves to load carrier tapes with different thicknesses. Referring to FIG. 5a, the height adjuster 305 has a structure in which a connection portion 305b is interposed between two disk-shaped fixing portions 305a. The connection portion 305b is processed so as to adjust the height of the first pad. The height adjuster 305 is turnably coupled to the upper support 308. An operator inserts a screwdriver into a groove formed in one of the fixing portions 305a and turns the screwdriver to vary the position of the connection portion 305b. In this way, the height of the first pad can be adjusted. FIG. 5b is a cross-sectional view taken along line A-A' of FIG. 5a. Referring to FIG. 5b, the connection portion 305b extending between the disk-shaped fixing portions 305a is partially cut away in both horizontal and vertical directions. The maximum distance x between the horizontal plane of the connection portion 305b and the circumference of the fixing portion is greater than that y between the vertical plane of the connection portion 305b and the circumference of the fixing portion. With these dimensions, the first pad may be situated on the horizontal or vertical plane of the connection portion 305b depending on the turning angle of the height adjuster, making it possible to adjust the height of the first pad. The horizontal plane is connected to the vertical plane via a curved portion. This connection structure reduces the force needed to turn the height adjuster at the contact between the connection portion 305b and the first pad. The connection portion 305b of the height adjuster is turnably coupled to the upper support while passing through a hollow formed in the upper support. The fixing portion 305a is larger in diameter than the recess of the upper support. These dimensions prevent the fixing portion 305a from withdrawing from the recess. FIG. 5c illustrates a process in which the height of the first pad is adjusted by the height adjuster. Referring to FIG. 5c, the first pad 303 is supported by the horizontal plane of the connection portion 305b and is fixedly positioned by the elastic force of the elastic members 306b. The term "fixedly positioned" as used herein means that the position of the first pad 303 is fixed when no force is applied to the elastic members 306b. An upward force applied to the first pad 303 places the first pad 303 away from the horizontal plane of the connection portion 305b to vary the position of the first pad 303. By the turning of the connection portion 305b, the first pad 303 is supported by the vertical plane of the connection portion 305b, and as a result, the relative position of the first pad 303 increases.

Figure 6A:
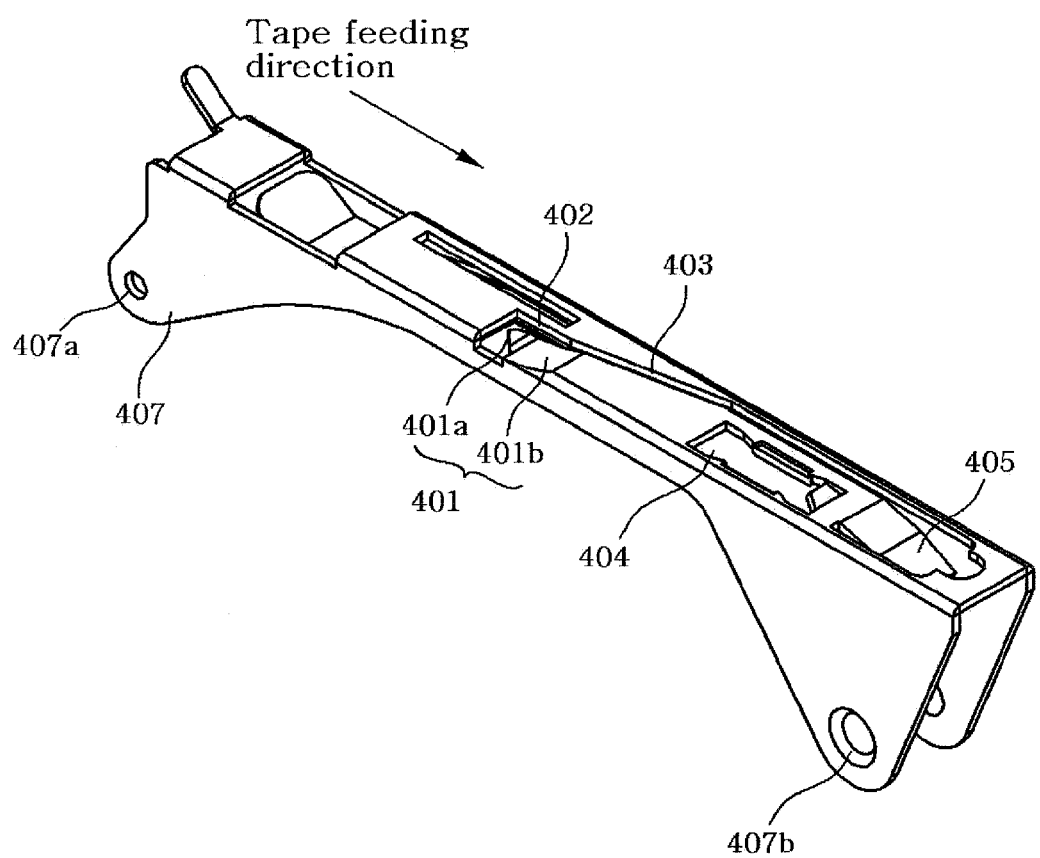
Figure 6B:
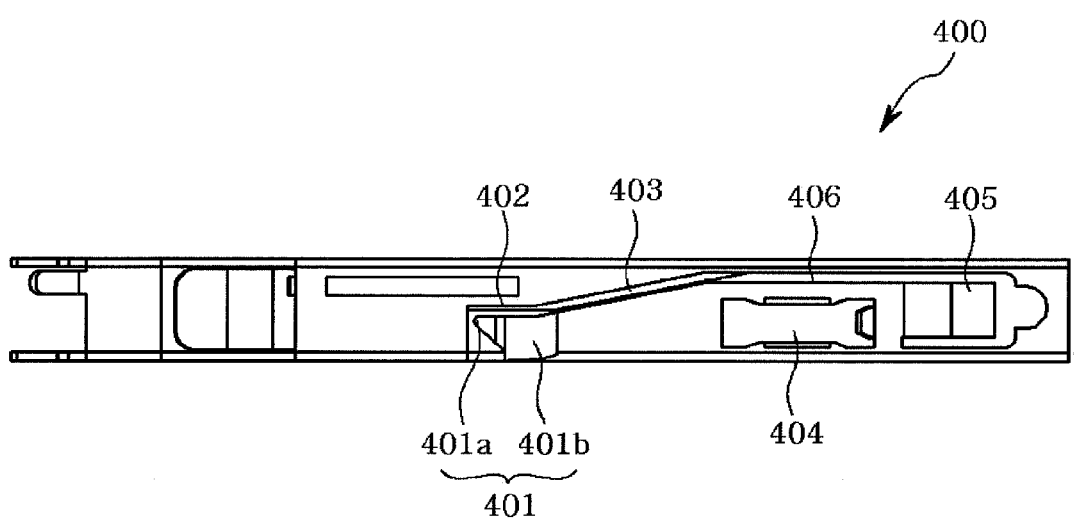

FIGS. 6a and 6b are perspective and plan views of the pick-up unit of the carrier tape feeder, respectively. Referring to FIGS. 6a and 6b, the pick-up unit 400 includes a knife portion 401, a folding-guiding portion 402, an inversion-guiding portion 403, a portion 404 through which the storage spaces are exposed, a portion 405 where the cover tape is pushed down, and a portion 406 where the cover tape is securely folded.

Figure 1:
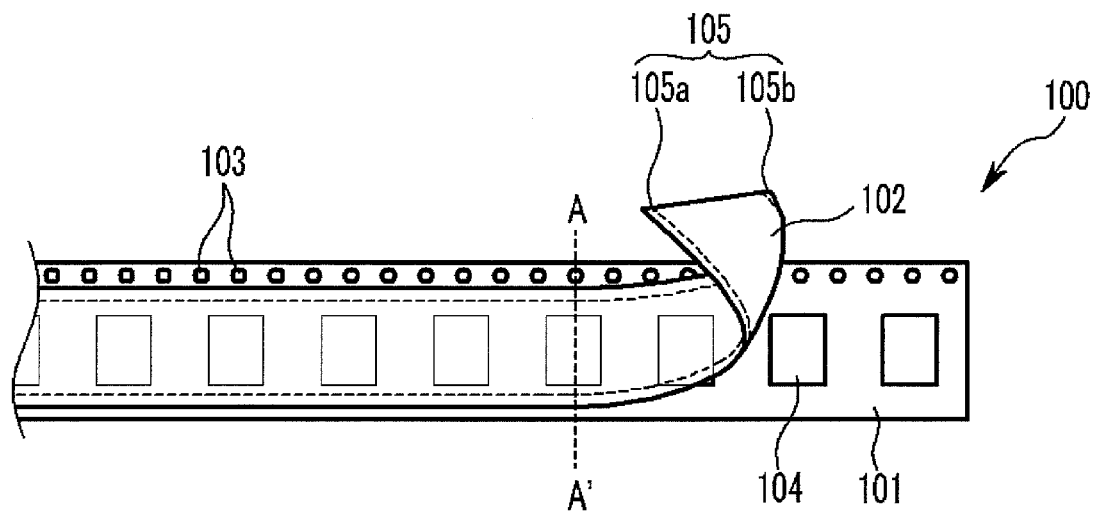
FIG. 1 illustrates the structure of a general carrier tape.
Figure 1:
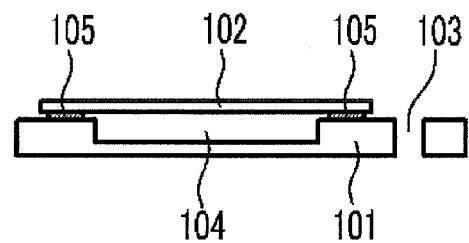

The knife portion 401 separates the cover tape from the base tape in the first adhesive portion (denoted by numeral 105a in FIG. 1) of each the carrier tapes continuously fed. In the folding-guiding portion 402, the separated cover tape is folded in the lengthwise direction in a state in which the cover tape is partially attached to the second adhesive portion (denoted by numeral 105b of FIG. 1). The upper and lower surfaces of the separated portion of the folded cover tape are inverted along the inversion-guiding portion 403, and overlapping of the cover tape with the base tape parallel to each other is induced in the inversion-guiding portion 403. In the folding-securing portion 406, the carrier tape having passed through the inversion-guiding portion 403 is substantially completely folded on the base tape. The push portion 405 pushes down the folded portion of the cover tape to prevent the folded portion from unfolding before discharge. After the cover tape is separated, the storage spaces are exposed to the outside through the exposure portion 404 where semiconductor chips can be picked up by suction. A cover tape separator is coupled to the main body of the carrier tape feeder by suitable means fastened to connection holes 407a and 407b of a connection portion 407. The structures and functions of the knife portion and the folding-guiding portion will be explained in more detail with reference to FIGS. 6c and 6d.

Figure 6D:
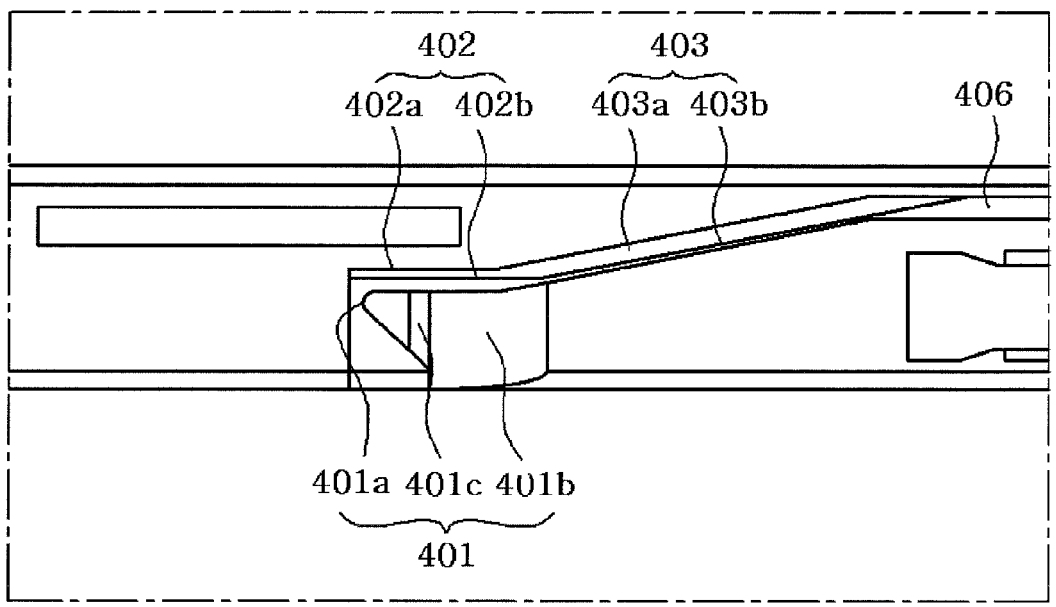

FIGS. 6c and 6d are enlarged perspective and plan views illustrating the knife portion and the folding-guiding portion of the pick-up unit, respectively. Referring to FIGS. 6c and 6d, the knife portion 401 includes a blade 401a, an extension 401c and a slope 410b. In the blade 401a and the extension 401c, the cover tape is separated from the base tape in the first adhesive portion. The blade 401a and the extension 401c are widened in the moving direction of the carrier tape. When the carrier tape is brought into contact with the knife portion 401, the distal end of the blade 401a is inserted into the space between the cover tape and the base tape and one side of the blade 401a or the extension 401c separates the base tape and the cover tape from each other. The slope 410b extends upward from the extension 401c along the moving direction of the carrier tape to form an inclined plane. The cover tape separated in the first adhesive portion is bent toward the second adhesive portion while being lifted along the inclined plane. The figures show that the blade 401a, the extension 401c and the slope 410b are distinguishable from one another. However, the blade may be modified into various forms so long as the distal end of the blade can be inserted into the space between the cover tape and the base tape, and the separated cover tape can be bent upward by the inclined plane. One side of the knife portion 401 and one side of the folding-guiding portion 402 opposed to each other may extend a length in parallel in the lengthwise direction of the carrier tape and may be spaced a distance apart from each other. Due to these structural characteristics, the cover tape can be continuously folded with a certain width.

In the folding-guiding portion 402, the cover tape is folded in the lengthwise direction in a state in which it is separated from the base tape in the first adhesive portion and is attached to the base tape in the second adhesive portion. The folding-guiding portion 402 is spaced from one lateral side of the knife portion 401. As mentioned in the explanation of the knife portion, one side of the folding-guiding portion 402 may be spaced a distance apart from the knife portion 401 and may extend a length in parallel with the knife portion 401 to in the lengthwise direction of the carrier tape and each other. The cover tape bent upward by the inclined plane of the knife portion is folded in the space between the knife portion 401 and the folding-guiding portion 402. It is preferred for better folding that the space has a small width. However, it is preferred that the width of the space is larger than the thickness of the cover tape because the cover tape passes through the space. The lateral side of the folding-guiding portion 402 parallel to the lengthwise direction of the carrier tape induces the formation of a bending line at which the cover tape begins to be bent upward. The meaning of the bending line can be well explained by the principle in which paper is linearly bent upward along the line of a measuring stick placed on the paper. The distal end of the lateral side of the folding-guiding portion 402 extends above the second adhesive portion. At the early stage where the cover tape is separated, the cover tape is supported and bent upward by the lateral edge of the slope 410b and the edge of a lower end portion 402b of the folding-guiding portion. Thus, the cover tape can be stably folded with the same width and can be discharged without being separated in the second adhesive portion. At the lateral side of the folding-guiding portion 402 opposed to the knife portion 401, an upper end portion 402a and the lower end portion 402b of the folding-guiding portion may be stepped. An upper end portion 403a and a lower end portion 403b of the inversion-guiding portion 403 may be stepped. The stepped portion of the folding-guiding portion 402 narrows the interval between the knife portion 401 and the folding-guiding portion 402, and the stepped portion of the inversion-guiding portion 403 narrows the interval between the knife portion 401 and the inversion-guiding portion 403, so that the cover tape can be easily folded in the space between the knife portion 401 and the folding-guiding portion 402, and the same time, the ease of processing of the space can be attained.

In an embodiment, the lower surface of the folding-guiding portion may is at a higher level than the blade of the knife portion. With this configuration, the folded shape of the cover tape is maintained constant after the cover tape is bent upward while passing through the space between the knife portion and the folding-guiding portion. A more detailed explanation of the configuration will be provided with reference to FIGS. 7 and 8.

Figure 7:
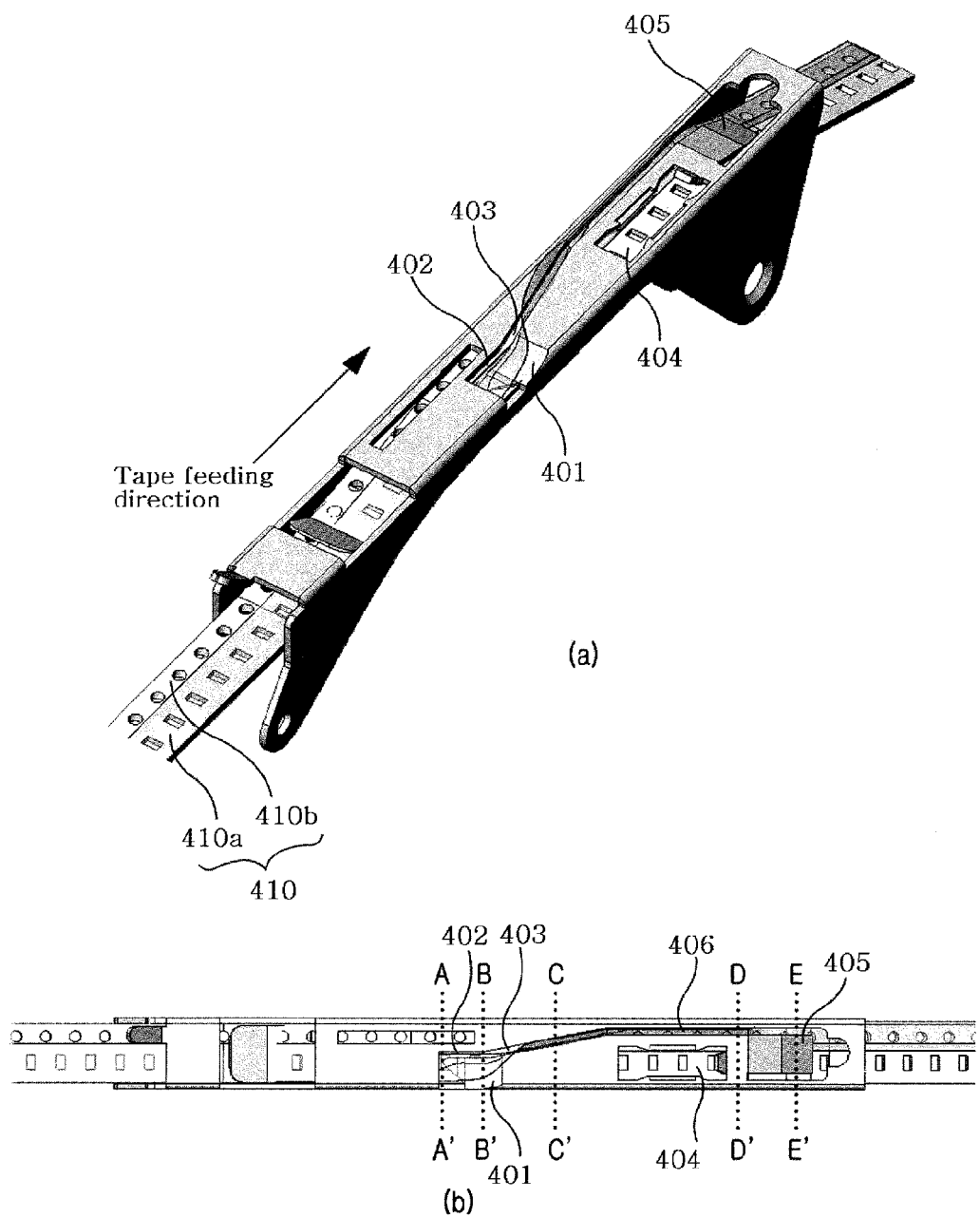
FIG. 7 illustrates a process in which a cover tape is separated in a pick-up unit of a carrier tape feeder according to an embodiment of the present invention.

FIG. 7 illustrates a perspective view (a) and a plan view (b) of a process in which the cover tape is separated in the pick-up unit. Referring to FIG. 7, when the carrier tape 410 passes through the knife portion 401, the base tape 410a is separated from the cover tape 410b in the first adhesive portion (not shown). The separated cover tape 410b is bent upward along the inclined plane of the knife portion 401 in the space between the knife portion 401 and the folding-guiding portion 402, and sequentially passes through the inversion-guiding portion 403, the folding-securing portion 406 and the push portion 405. As a result of this process, the cover tape 410b is completely folded before discharge. Only the base tape 410a, from which the cover tape 410b is separated, is moved to the exposure portion 404. Accordingly, semiconductor chips accommodated in the storage spaces can be picked up by an external device.

Figure 8:
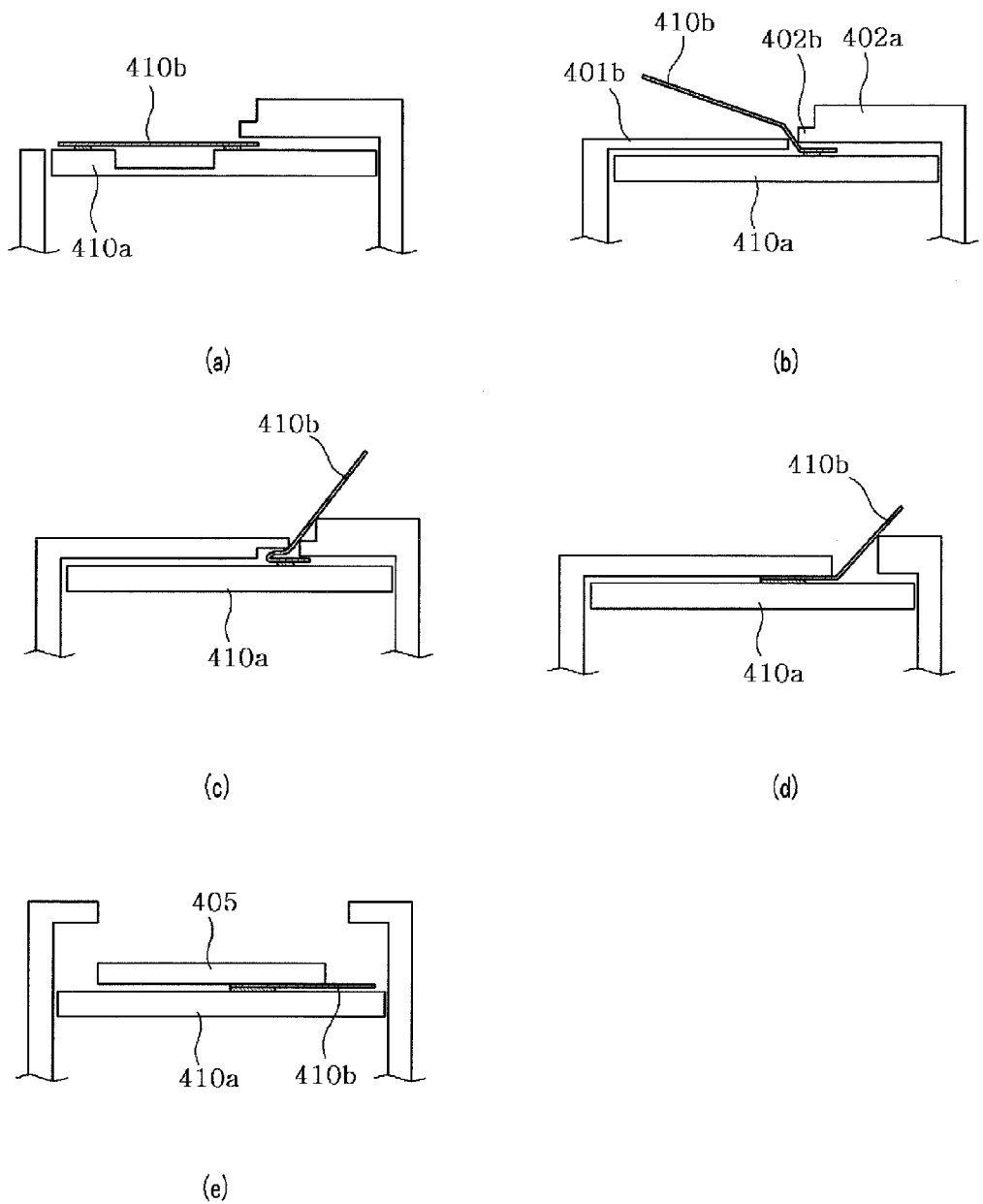
FIG. 8 stepwise illustrates a separation process of a cover tape in a pick-up unit of a carrier tape feeder according to an embodiment of the present invention.

FIG. 8 stepwise illustrates a process in which the cover tape is separated and folded after passing through lines A-A' to E-E'. Referring to FIG. 8, the cover tape 410b is attached to the base tape 410a before being introduced into the knife portion (a); the cover tape 410b is separated from the base tape 410a in the first adhesive portion by the knife portion and is bent upward from the lower end portion 402b of the folding-guiding portion (b); the separated cover tape 410b is bent at an angle of 90° or more and begins to be folded while moving along the inversion-guiding portion (c); the separated cover tape 410b is almost completely folded while moving along the folding-securing portion (d); and the bent portion of the separated cover tape 410b is pushed down by the push portion 405 (e). As a result of this process, the cover tape 410b can be discharged in a completely folded state.

Figure 9:
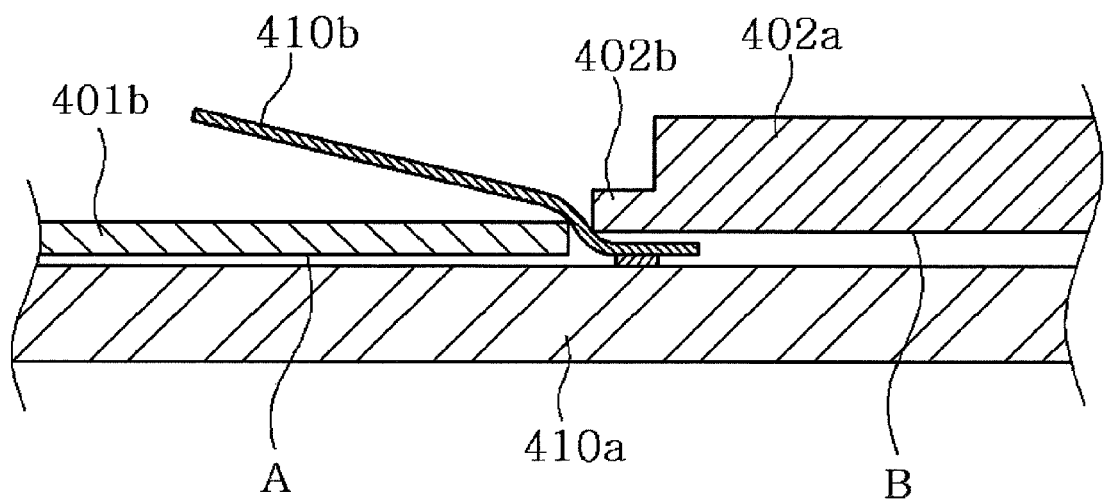
FIG. 9 is a view for explaining the principle of how a cover tape is bent upward by a knife portion and a stepped portion formed at the lower surface of a folding-guiding portion in a pick-up unit of a carrier tape feeder according to an embodiment of the present invention.

FIG. 9 is an enlarged view of FIG. 8b and explains the principle of how the cover tape is bent upward by the knife portion and the stepped portion formed at the lower surface of the folding-guiding portion. Referring to FIG. 9, the lower surface B of the folding-guiding portion is formed at a position higher than the lower surface A of the knife portion. With this configuration, after the cover tape 410b is separated from the base tape by the blade (not shown) of the knife portion 410a and is lifted by the inclined portion 401b, the lateral edge of the slope 410b and the edge of the lower end portion 402b of the folding-guiding portion support the cover tape 410b to bend the cover tape 410b upward. The edge of the lower end portion of the folding-guiding portion becomes a point where the cover tape 410b begins to be bent upward. After this point, the cover tape 410b is folded in a uniform form.

The pick-up unit of the carrier tape feeder is characterized in that the lateral distal end of the folding-guiding portion extends above the second adhesive portion, and effects thereof can be found in (b) and (c) of FIG. 8 and FIG. 9. At the early stage where the cover tape is separated, the cover tape is supported and bent upward by the lateral edge of the slope 410b and the edge of the lower end portion 402b of the folding-guiding portion, leaving little possibility that the cover tape may be separated from the base tape in the second adhesive portion. The separated cover tape 410b is bent and folded at an angle of 90° or more along the inversion-guiding portion. The separation of the cover tape from the base tape in the second adhesive portion cannot occur at the folded position of the cover tape 410b. Accordingly, the cover tape can be stably folded with the same width before discharge without being separated in the second adhesive portion.

The separated cover tape can be discharged from the carrier tape feeder by a forward discharge method or a backward discharge method. According to the forward discharge method, the carrier tape is discharged in a state in which one side of the cover tape is separated in the pick-up unit and the other side thereof is attached to the base tape. According to the backward discharge method, the cover tape completely separated from the carrier tape is discharged through the discharge unit. The forward and backward discharge methods can be suitably selected depending on the model of the carrier tape and the accommodation mode of chips. The forward discharge method is advantageous in that the discharge process is simplified and no static electricity is generated. However, in the case where chips accommodated in the storage spaces are large in height and come into contact with the lower surface of the cover tape, the blade of the pick-up unit may be brought into contact with the chips, which increases the risk of damage to the chips and makes it difficult to stably separate the cover tape. In view of this exceptional case, the discharge unit is further added to the carrier tape feeder of the present invention.

Figure 10:
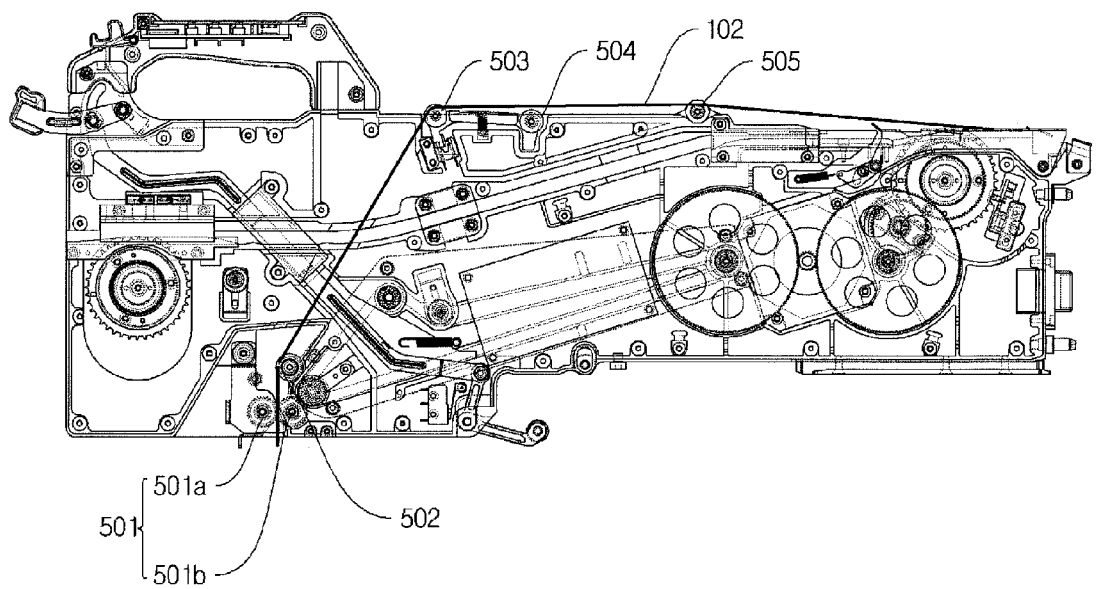
FIG. 10 illustrates the backward discharge of a cover tape from a carrier tape feeder according to an embodiment of the present invention.

FIG. 10 illustrates the backward discharge of the cover tape from the carrier tape feeder. Referring to FIG. 10, the cover tape 102 separated in the exposure portion of the pick-up unit passes through a fourth guide roller 505, a third guide roller 504, a second guide roller 503, a first guide roller 502 and discharge gears 501 before discharge. The guide rollers 502, 503, 504 and 505 serve to stably guide and transfer the cover tape 102 to the discharge gears 501. Particularly, the second guide roller 503 is associated with the operation of the sensing unit in the discharge unit, which will be explained in FIG. 14. The discharge gears 501 consist of a pair of gears 501a and 501b and are constructed such that the cover tape 102 is pulled at a constant tension by the engagement with the gears 501a and 501b.

Figure 11:
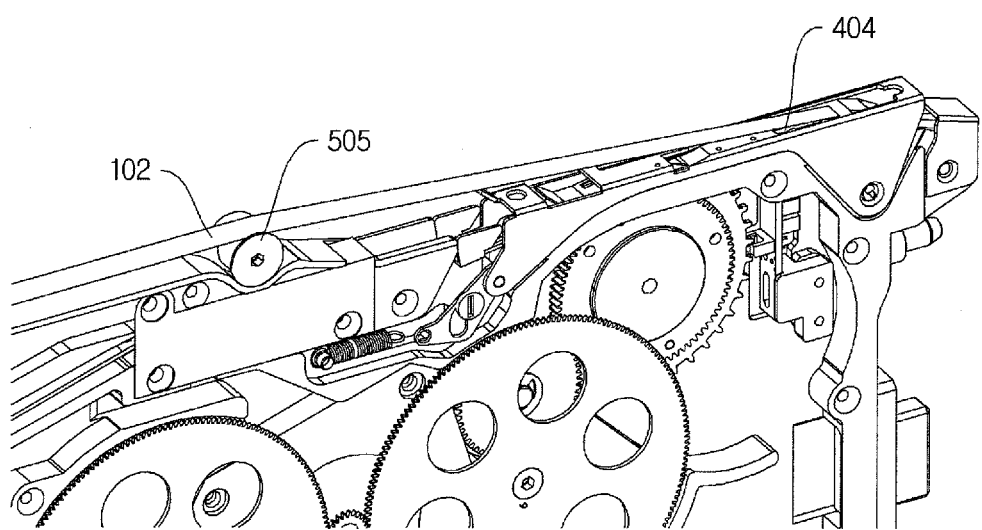
FIG. 11 is an enlarged view illustrating a portion in which a cover tape begins to be discharged backward.

FIG. 11 is an enlarged view illustrating a portion in which the cover tape begins to be discharged backward. Referring to FIG. 11, the cover tape 102 separated at one end of the exposure portion 404 of the pick-up unit is bent back at an angle of 180° and transferred backward. In order for the cover tape 102 to be discharged through the discharge unit, the cover tape separated from the base tape in the exposure portion 404 must pass through the guide rollers and be engaged with the discharge gears by manual operation. In some cases, the front portion of the cover tape may be previously separated from the base tape before feeding depending on the kind of the carrier tape.

Figure 12:
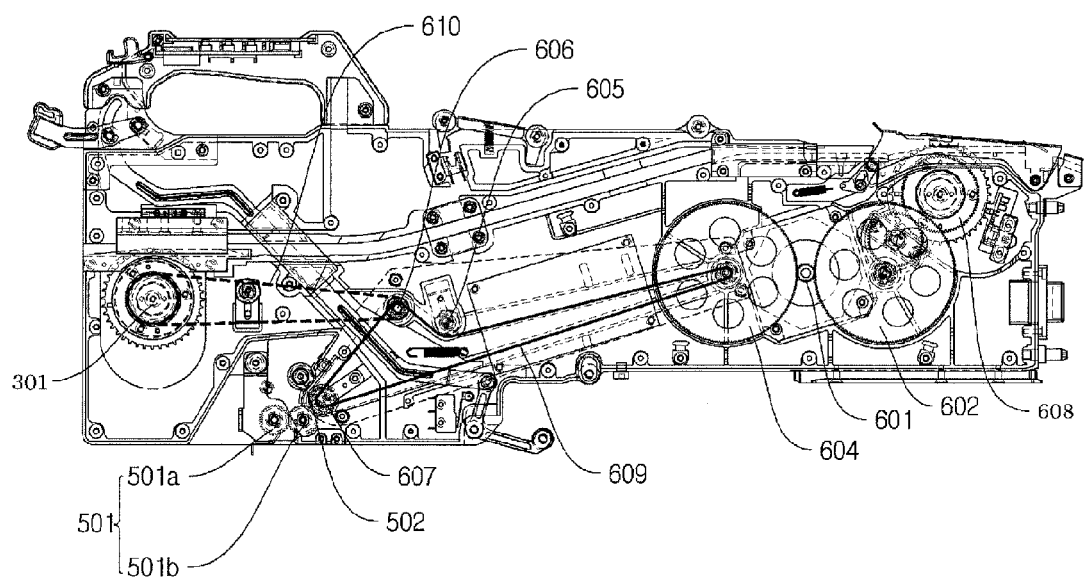
FIG. 12 is a view illustrating the transmission of power from a driving motor to a loading unit, a pick-up unit and a discharge unit in a carrier tape feeder according to an embodiment of the present invention.

The carrier tape feeder of the present invention may use a single driving motor to drive the loading unit, the pick-up unit and the discharge unit. FIG. 12 is a view illustrating the transmission of power from a driving motor 601 to the loading unit, the pick-up unit and the discharge unit. Referring to FIG. 12, a driving force is transmitted from the driving motor 601 to the respective units through a first power transmission assembly 602, a second power transmission assembly 604, a driving roller 605, a driving pulley 606, a driving gear 607, a first belt 609 and a second belt 610. The driving force is transmitted from the driving motor 601 to the pick-up unit by the following process. First, the driving motor 601 is rotated to generate a driving force. The driving force is transmitted to a gear to rotate the first power transmission assembly 602. The driving force is transmitted to a gear to rotate the loading driver 301. The sprocket of the loading driver 301 is engaged with the transport holes of the carrier tape to transfer the carrier tape. The driving force is transmitted from the driving motor 601 to the loading unit by the following process. First, the driving motor 601 is rotated to generate a driving force. The driving force is transmitted to rotate the second power transmission assembly 604 and the driving pulley 606 connected to the second power transmission assembly 604 via the first belt 609 and to drive a pick-up driver 608 connected to the driving pulley 606 via the second belt 610. A sprocket of the pick-up driver 608 is engaged with the transport holes of the carrier tape to transfer the carrier tape. The driving force is transmitted from the driving motor 601 to the discharge unit by the following procedure. First, the driving motor 601 is rotated to generate a driving force. The driving force is transmitted to rotate the second power transmission assembly 604 and the driving gear 607 connected to the second power transmission assembly 604 via the first belt 609, and to drive the discharge gears 501 connected to the driving gear 607 via a gear. The cover tape is transferred between the gears 501*a* and 501*b*.

The use of a single driving motor to drive the loading unit, the pick-up unit and the discharge unit reduces the number of parts, achieves improved durability due to simplified operation, and reduces the volume of the apparatus. If the driving force of the driving motor is not sufficient, an additional driving motor may be installed in the loading unit or the discharge unit. This construction will be explained with reference to FIG. 16.

Figure 13:
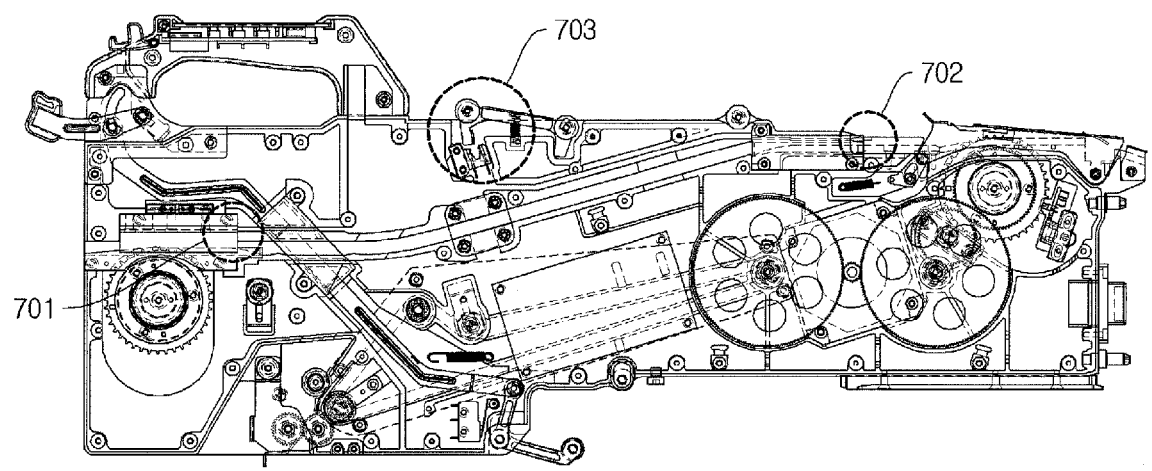
FIG. 13 illustrates a carrier tape feeder according to an embodiment of the present invention in which sensing units are provided in a loading unit, a pick-up unit and a discharge unit.

The sensing units of the carrier tape feeder are constructed such that the transfer state of carrier tapes and the discharge state of cover tapes can be monitored. If the feeding of carrier tapes is stopped by an unexpected process fault, damage to the overall processes including chip mounting may occur. To minimize such process damage, each of the loading unit, the pick-up unit and the discharge unit may be provided with the sensing unit. FIG. 13 illustrates the sensing units 701, 702 and 703 provided in the loading unit, the pick-up unit and the discharge unit, respectively. In the figure, only the positions of the sensing unit 701 and the sensing unit 702 are illustrated because the constructions and operations of the sensing units 701 and 702 are already known in the art. Each of the loading driver and the pick-up driver also has a sensing unit (not shown) for detecting the teeth of a sprocket. Each of the sensing unit 701 and the sensing unit 702 includes a part for irradiating light onto one surface of the carrier tape and a light input part opposed to the light irradiation part to sense the light received through the carrier tape. The sensing unit 701 irradiates light to detect the presence or absence of chips, and the sensing unit 702 irradiates light onto the transport holes to detect whether or not the carrier tape is normally transferred. If the absence of chips is detected in the sensing unit 701 or abnormal transfer of the carrier tape is detected in the sensing unit 702, the operations of the carrier tape feeder and the chip mounter are stopped and an alarm goes off, notifying the operator to take action. The sensing unit 703 is not provided in the discharge unit designated by numeral 500 in FIG. 2, and instead is provided on the carrier tape feeder. In addition to the detection of abnormal transfer of carrier tapes, the sensing units 701 and 702 perform a function associated with continuous feeding of carrier tapes. Each of the sensing units of the loading driver and the pick-up driver performs a function to correct the sprocket. Details regarding the functions of the sensing units will be explained below with reference to FIGS. 12 and 13. The characteristic constitution of the sensing unit 703 will also be explained below with reference to FIG. 14.

The loading unit, the pick-up unit, the loading driver and the pick-up driver of the carrier tape feeder have the individual sensing units. Referring to FIG. 12, each of the loading driver 301 and the pick-up driver 608 has a sprocket. Although not shown in the figure, each of the sensing units of the loading driver 301 and the pick-up driver 608 is provided at one side of the sprocket to detect the teeth of the sprocket. Each of the sensing units counts the number of the detected teeth to measure the rotating distance of the sprocket. Referring to FIG. 13, the sensing units 701 and 702 are provided in the loading unit and the pick-up unit, respectively. The sensing units of the loading unit, the pick-up unit, the loading driver and the pick-up driver perform several special functions, as will be explained below.

The first function is associated with continuous feeding of carrier tapes. While one of the carrier tapes is fed, another carrier tape is loaded and is ready to be fed in the loading unit. At this time, there exists the danger that after the fed carrier tape passes through the loading unit, the subsequent carrier tape may not be fed by an operator's mistake. When the sensing unit 701 detects the absence of chips after the fed carrier tape is exhausted, the sensing unit of the pick-up driver memorizes the transfer distance of the carrier tape and rapidly moves the subsequently fed carrier tape by a distance corresponding to the transfer distance, so that the two carrier tapes can be continuously fed into the pick-up unit.

The second function is associated with the formation of dummy storage spaces of the carrier tapes. The carrier tapes are wound on reels and loaded into the loading unit. The tip portions of the carrier tapes fixed to the reels are badly bent, which may make normal storage of the chips difficult. Taking into consideration the difficulty, each of the tip portions of the carrier tapes is formed with a dummy storage space in which no chip is provided. When the sensing unit 701 detects the dummy storage space (exactly, detects no chip in the dummy storage space), the pick-up driver moves the carrier tape rapidly without stopping the carrier tape so that the dummy storage space can be skipped in the pick-up zone.

The third function is associated with the detection of an abnormal location of the transport holes in the sensing unit of the pick-up unit and the positional correction of the sprocket of the loading driver. The carrier tape may be curved during feeding, which makes it impossible for the sensing unit 702 to detect the transport holes. In this case, the feeding of the carrier tape is temporally stopped and the sprocket of the loading driver is minutely rotated to correct its position so that the transport holes can be accurately detected by the sensing unit 702. This correction is usually made when the sensing unit 702 detects an abnormal location of the transport holes at the initial stage of the carrier tape feeding.

Figure 14:
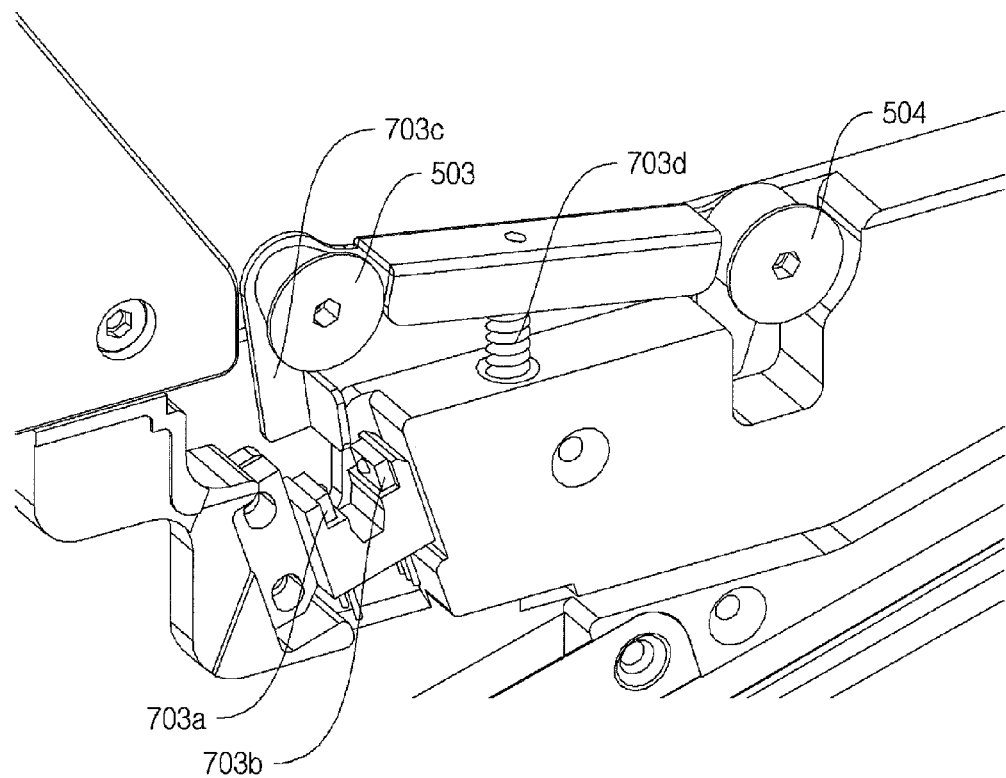
FIG. 14 is an enlarged view illustrating a sensing unit of a discharge unit of a carrier tape feeder according to an embodiment of the present invention.

FIG. 14 is an enlarged view illustrating the sensing unit 703. Referring to FIG. 14, the sensing unit 703 includes a light irradiation part 703*a*, a light input part 703*b* and a light blocking part 703*c*. When the cover tape passes through the second guide roller 503 and the third guide roller 504, the second guide roller 503 is moved downward to position the light blocking part 703*c* between the light irradiation part 703*a* and the light input part 703*b*. Here, light irradiated from the light irradiation part 703*a* does not reach the light input part 703*b*. If the cover tape is cut or deviated from the path during discharge of the cover tape, the second guide roller 503 is moved upward by the elasticity of a spring 703*d*. As a result, the light blocking part 703*c* is not located between the light irradiation part 703*a* and the light input part 703*b* and light from the light irradiation part 703*a* enters the light input part 703*b*, so that the sensing unit 703 can detect abnormal discharge state of the carrier tape.

Figure 15A:
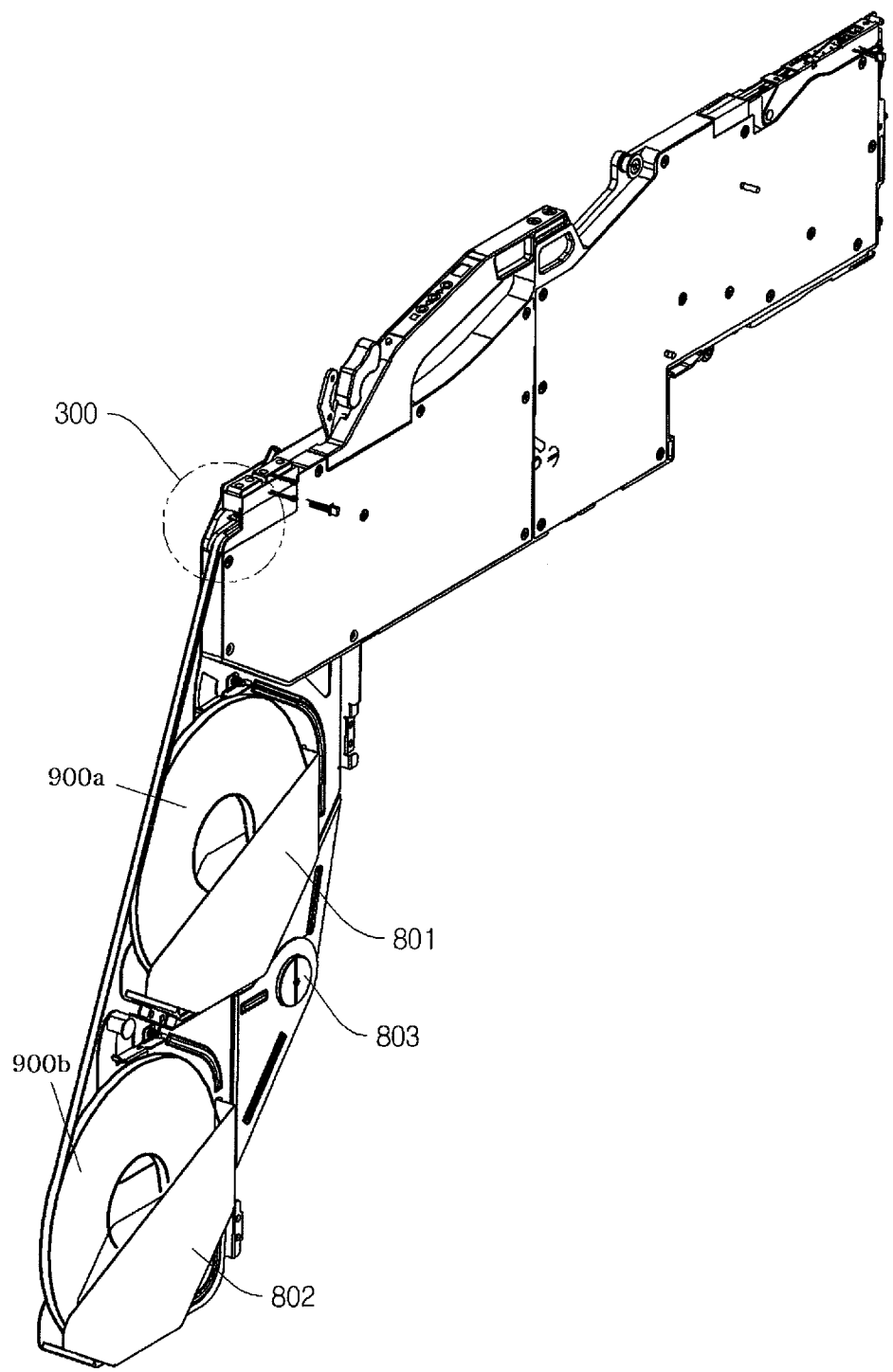
FIGS. 15a and 15b illustrate upper and lower reel stands for a carrier tape feeder according to an embodiment of the present invention.
Figure 15B:
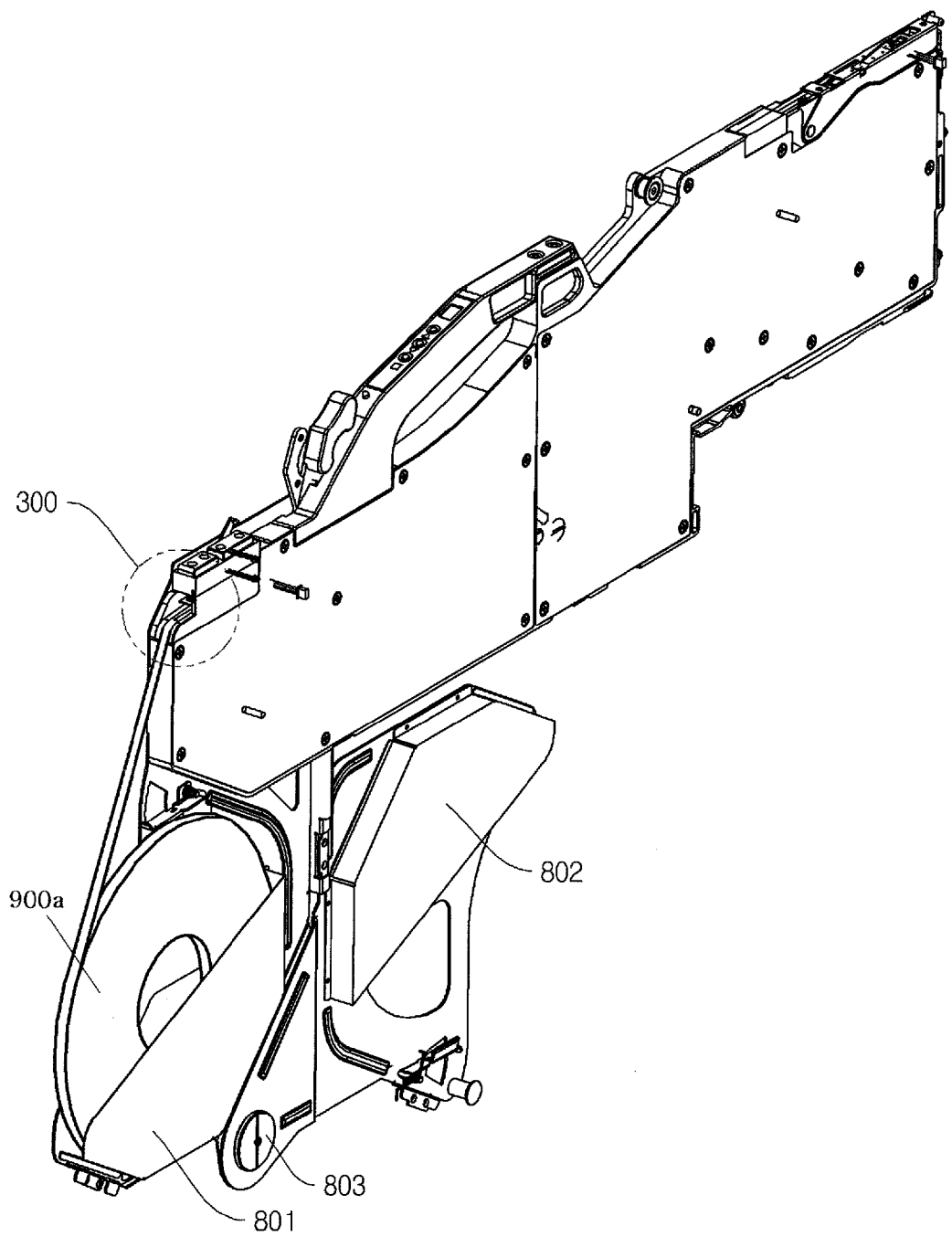

FIGS. 15*a* and 15*b* illustrate upper and lower reel stands for the carrier tape feeder. Referring to FIG. 15*a*, the upper and lower reel stands 801 and 802 are installed under the loading unit 300 of the carrier tape feeder. The upper reel stand 801 is connected to the lower reel stand 802 via a rotating shaft 803 so that the lower reel stand 802 are turnable about the rotating shaft 803 in the vertical direction. In each of the reel stands, a carrier tape reel is fixed in a wound form and stably feeds the carrier tapes to the loading unit. Upper and lower carrier tape reels 900*a* and 900*b* are accommodated in the upper and lower reel stands 801 and 802, respectively. Carrier tapes are fed from the respective carrier tape reels to the loading unit 300. The lower reel stand 802 protrudes relative to the upper reel stand 801 to prevent the carrier tapes fed from the upper and lower carrier tape reels 900*a* and 900*b* from overlapping each other. This construction can maximize the ability of the loading unit to simultaneously load two carrier tapes and the ability of the pick-up unit to separate cover tapes without manual operation. Referring to FIG. 15*b*, the lower reel stand 802 is turnable about the rotating shaft 803 in the vertical direction and can be folded back to the rear of the upper reel stand 802. The folded lower reel stand 802 may be fixed by suitable means such as a fixing pin. This arrangement is applied when the carrier tape feeder is operated using the carrier tape fed from the upper reel stand 801 to which the upper carrier tape reel 900*a* is fixed, and is advantageous in that a sufficient space for installation can be ensured and the reels can be replaced with ease because the lower reel stand 802 does not protrude.

Figure 16:
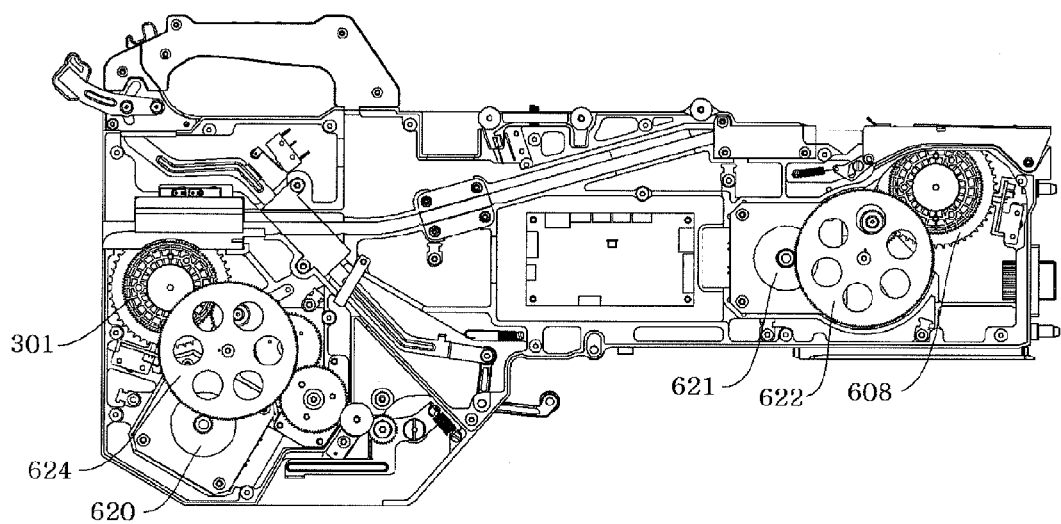
FIG. 16 illustrates driving processes of a loading unit, a pick-up unit and a discharge unit of a carrier tape feeder according to an embodiment of the present invention by the use of two motors.

FIG. 16 illustrates driving processes of the loading unit, the pick-up unit and the discharge unit using two motors. Referring to FIG. 16, a first driving motor 620 is installed below the loading unit and a second driving motor 621 is installed below the pick-up unit. The first driving motor 620 transmits power to the loading driver 301 via a power transmission assembly 624, and the second driving motor 621 transmits power to the pick-up driver 608 via a power transmission assembly 622. The power transmission assembly 624 is provided with additional power transmission means in a direction opposite to the loading driver 301 to transmit power to the discharge unit. The use of the first driving motor for driving the loading unit and the discharge unit and the second driving motor for driving the pick-up unit is advantageous in that the ability to deal with different sized and structured carrier tapes can be improved. That is, the use of the two motors for driving the loading unit, the pick-up unit and the discharge unit enables stable transfer of carrier tapes even when a large driving force is needed to transfer the carrier tapes.

As is apparent from the above description, the carrier tape feeder of the present invention possesses the following effects.

First, after the loading unit feeds one carrier tape, another carrier tape is loaded and is ready to be fed. This continuous feeding enables replacement of the carrier tape reel in a simple manner and shortens the working time. In addition, the loading unit is designed such that the height of the pad can be adjusted depending on the thickness of carrier tapes. This design enables carrier tapes with different thicknesses to be fed into the carrier tape feeder without causing defects.

Secondly, the pick-up unit is constructed such that a cover tape and a base tape can be discharged simultaneously in a state in which a portion of the cover tape is attached to the base tape. Due to this construction, the structure can be simplified and the folding of the cover tape can be stabilized at a fixed position, thus minimizing the occurrence of defects. In addition, the cover tape can be prevented from getting entangled or coming into contact with each other to generate static electricity, leading to productivity improvement.

Thirdly, the discharge unit is constructed such that a cover tape is separated from a base tape and is discharged backward. Therefore, the cover tape and the base tape can be discharged simultaneously or separately depending on the kind of the carrier tape. That is, the ability of the discharge unit to deal with various kinds of carrier tapes can be extended.

Fourthly, a single motor can be used to drive the loading unit, the pick-up unit and the discharge unit of the carrier tape feeder. The use of a single motor simplifies the overall structure of the carrier tape feeder and can increase the operational stability of the carrier tape feeder. Alternatively, two motors may be used to drive the loading unit, the pick-up unit and the discharge unit of the carrier tape feeder, extending the ability to deal with various kinds of carrier tapes.

Fifthly, the upper reel stand and the lower reel stand of the carrier tape feeder enable simultaneous loading of two carrier tape reels. The lower reel stand can be folded upward via a rotating shaft. Therefore, when it is intended to load only one carrier tape reel, a sufficient space for loading can be ensured and reels can be replaced with ease.

While the embodiments of the present invention have been described, it will be understood by those skilled in the art that various modifications and variations are possible without changing the essential features of the invention. Therefore, it should be noted that the forgoing embodiments do not serve to limit the invention but are set forth for illustrative purposes. The scope of the invention is defined by the appended claims, and all variations or modifications or their equivalents made within the meanings and scope of the claims should be construed as falling within the scope of the invention.

What is claimed is:

1. A carrier tape feeder comprising:
a unit for loading a first carrier tape;
a picking-up unit where chips are picked up; and
a driving unit,
wherein the pick-up unit comprises a knife portion for separating a cover tape from a base tape in a first adhesive portion, a folding-guiding portion spaced from one lateral side of the knife portion to induce folding of the cover tape separated by the knife portion in the lengthwise direction in a state in which the cover tape is partially attached to the base tape in a second adhesive portion and an inversion-guiding portion extending along obliquely along a tape feeding direction from the knife portion and the folding-guiding portion to induce inversion of the upper and lower surfaces of the cover tape folded in the folding-guiding portion so as to be superimposed on the base tape, and wherein a distal end of a lateral side of the folding-guiding portion opposed to the knife portion extends above the second adhesive portion.

2. The carrier tape feeder according to claim 1, wherein the folding-guiding portion has a lower surface at a higher level than the blade of the knife portion.

3. The carrier tape feeder according to claim 1, wherein the loading unit comprises: a lower support having an inclined portion and a horizontal portion; a first pad disposed above the horizontal portion and having first elastic members for applying pressure to an upper surface of the first carrier tape during feeding, wherein a lower surface of the first pad is parallel to the horizontal portion and the first elastic members imparts elastic force to the first pad; and a second pad disposed above the inclined portion and having second elastic members for applying pressure to an upper surface of a second carrier tape that is loaded for being fed next, the second carrier tape on being fed is overlapped on the first carrier tape, wherein a lower surface of the second pad is parallel to the inclined portion and the second elastic members imparts elastic force to the second pad.

4. The carrier tape feeder according to claim 3, wherein a stepped portion is formed between the lower surface of the first pad and a boundary formed in the horizontal portion and the inclined portion of the lower support.

5. The carrier tape feeder according to claim 3, further comprising a height adjuster for the first pad.

6. The carrier tape feeder according to claim 1, wherein the driving unit comprises a driving motor, a first power transmission assembly, a second power transmission assembly, a first belt and a second belt to transmit a driving force from the driving motor to the loading unit, the pick-up unit and the discharge unit, and the driving force is transmitted to the pick-up unit through the first power transmission assembly, to the loading unit through the second power transmission assembly, the first belt and the second belt, and to the discharge unit through the second power transmission assembly and the first belt.

7. The carrier tape feeder according to claim 1, wherein the driving unit comprises first driving means for driving the loading unit and the discharge unit, and second driving means for driving the pick-up unit.

8. The carrier tape feeder according to claim 1, further comprising sensing units for detecting a transfer state of the carrier tape and a sensing unit for detecting a discharge state of the cover tape.

9. The carrier tape feeder according to claim 1, further comprising a plurality of reel stands installed under the loading unit to load carrier tape reels therein.

10. The carrier tape feeder according to claim 9, wherein the reel stands are an upper reel stand and a lower reel stand turnably connected to the upper reel stand in a vertical direction.

* * * * *